United States Patent
Rahnavard

(10) Patent No.: US 7,199,577 B1
(45) Date of Patent: Apr. 3, 2007

(54) CHARACTERIZING MULTIPLE DC SUPPLIES DECOUPLING CAPACITORS IN PCB BY ANTI-RESONANT FREQUENCIES

(75) Inventor: Mohammad H. Rahnavard, Rancho Palos Verdes, CA (US)

(73) Assignee: Xerox Corporation, Stamford, CT (US)

( * ) Notice: Subject to any disclaimer, the term of this patent is extended or adjusted under 35 U.S.C. 154(b) by 0 days.

(21) Appl. No.: 11/277,698

(22) Filed: Mar. 28, 2006

(51) Int. Cl.
*G01R 31/28* (2006.01)

(52) U.S. Cl. .................... 324/158.1; 324/311
(58) Field of Classification Search ............... None
See application file for complete search history.

(56) References Cited

U.S. PATENT DOCUMENTS

| | | | |
|---|---|---|---|
| 6,477,694 B1* | 11/2002 | Irino et al. | 716/15 |
| 6,700,390 B2* | 3/2004 | Gauthier et al. | 324/600 |
| 6,781,355 B2* | 8/2004 | Gauthier et al. | 323/233 |
| 6,842,351 B2* | 1/2005 | Gauthier et al. | 363/39 |
| 6,882,236 B2* | 4/2005 | Dinn et al. | 331/138 |
| 2003/0169121 A1* | 9/2003 | Grebenkemper | 333/12 |
| 2004/0041634 A1* | 3/2004 | Sugiura | 330/302 |
| 2004/0088661 A1* | 5/2004 | Anderson et al. | 716/5 |
| 2004/0124715 A1* | 7/2004 | Huang et al. | 307/127 |
| 2005/0218972 A1* | 10/2005 | Hazucha et al. | 327/551 |

* cited by examiner

*Primary Examiner*—Ha Tran Nguyen
*Assistant Examiner*—Richard Isla-Rodas
(74) *Attorney, Agent, or Firm*—Oliff & Berridge, PLC

(57) ABSTRACT

Methods and systems formulate the impedance for decoupling capacitors of a multiple power supply printed circuit board considering plane capacitance, series resonant frequencies, parallel resonant frequencies and impedance. The impedances are evaluated at anti-resonant frequencies, which have been found to be the problematic frequencies and potentials for high impedance. Once such impedance at selected frequencies have been determined, they can be compared to target values, set for example by various system integrity or EMI standards or design parameters, to assess whether a particular DC power supply system performs properly from signal integrity or electromagnetic radiation points of view. This ability to readily assess a high probability of compliance theoretically will reduce research and development time and budget, reducing possibly many iterations of board designs and trials and error physical testing.

12 Claims, 8 Drawing Sheets

Power Supply 3.3 V; Cb=0.0174μF; R1=0.04 Ω; L1=2nH (0.1μF); C1=0.1μF; n=107

| f (Hz) | ω | ωC1R1 | ω²L1C1 | ω(Cb+nC1) | ω²CbC1R1 | ω³CbL1C1 | Y1 Denom. | Real Y1 | Imag. Y1 |
|---|---|---|---|---|---|---|---|---|---|
| 2.79E+08 | 1.75E+09 | 7.019644 | 615.9425 | 18808.08 | 2.14E+02 | 18808.08 | 378203.6 | 0.34852 | 0.003979 |
| 3.12E+08 | 1.96E+09 | 7.833908 | 767.1264 | 20989.78 | 2.67E+02 | 26141.75 | 587011.1 | 0.279663 | 6.727558 |
| 3.2E+08 | 2.01E+09 | 8.045846 | 809.1954 | 21557.64 | 2.82E+02 | 28321.38 | 653244.5 | 0.265089 | 8.371581 |

FIG. 3

Power Supply 3.3 V; $C_b = 0.0174\mu F$; $R_1 = 0.04 \Omega$; $L_1 = 1nH (0.01\mu F)$; $C_1 = 0.01\mu F$; $n = 65$

| f (Hz) | ω | ωC1R1 | ω²L1C1 | ω(Cb+nC1) | ω²CbC1R1 | ω³CbL1C1 | Y2 Denom. | Real Y2 | Imag. Y2 |
|---|---|---|---|---|---|---|---|---|---|
| 2.79E+08 | 1.75E+09 | 0.7019644 | 30.79713 | 1171.228 | 2.14E+01 | 940.4042 | 888.3615 | 0.901351 | -7.72527 |
| 3.12E+08 | 1.96E+09 | 0.7833908 | 38.35632 | 1307.088 | 2.67E+01 | 1307.088 | 1396.108 | 0.714317 | 0.01498 |
| 3.2E+08 | 2.01E+09 | 0.8045846 | 40.45977 | 1342.449 | 2.82E+01 | 1416.069 | 1557.721 | 0.675316 | 1.879454 |

FIG. 4

Power Supply 3.3 V; Cb = 0.0174μF; R1 = 0.04 Ω; L1 = 1nH (0.001μF); C1 = 0.001μF; n = 53

| f (Hz) | ω | ω C1R1 | $\omega^2$L1C1 | ω (Cb+nC1) | $\omega^2$CbC1R1 | $\omega^3$CbL1C1 | Y3 Denom. | Real Y3 | Imag. Y3 |
|---|---|---|---|---|---|---|---|---|---|
| 2.79E+08 | 1.75E+09 | 0.07019644 | 3.079713 | 123.5457 | 2.14E+00 | 94.04042 | 4.330132 | 1.507804 | -14.1363 |
| 3.12E+08 | 1.96E+09 | 0.07833908 | 3.835632 | 137.8768 | 2.67E+00 | 130.7088 | 8.046947 | 1.010512 | -2.49992 |
| 3.2E+08 | 2.01E+09 | 0.08045846 | 4.045977 | 141.6069 | 2.82E+00 | 141.6069 | 9.28445 | 0.923854 | 0.024403 |

FIG. 5

| f (Hz) | ω | Real Y1 | Imag. Y1 | Real Y2 | Imag. Y2 | Real Y3 | Imag. Y3 | Real Y Total | Imag. Y Total | Real Z Total Ω | Imag. Z Total Ω |
|---|---|---|---|---|---|---|---|---|---|---|---|
| 2.79E+08 | 1.75E+09 | 0.34852 | 0.003979 | 0.901351 | -7.72527 | 1.507804 | -14.1363 | 2.757675 | -21.8576 | 0.362624 | 0.045034 |
| 3.12E+08 | 1.96E+09 | 0.279663 | 6.727558 | 0.714317 | 0.01498 | 1.010512 | -2.49992 | 2.004492 | 4.242614 | 0.498879 | -0.19269 |
| 3.2E+08 | 2.01E+09 | 0.265089 | 8.371581 | 0.675316 | 1.87954 | 0.923854 | 0.024403 | 1.864258 | 10.27544 | 0.536406 | -0.09422 |

FIG. 6

CHARACTERIZING MULTIPLE DC SUPPLIES DECOUPLING CAPACITORS IN PCB BY ANTI-RESONANT FREQUENCIES

BACKGROUND

Methods and systems theoretically characterize multiple DC power supply decoupling capacitors in a printed circuit board by analysis of anti-resonant frequencies to help assess compliance with various standards or regulations.

Power distribution is crucial in printed circuit board (PCB) design. DC-to-DC converters are used in printed circuit boards to create a sub-system power source isolated from a main power system. However, an isolated power source is still a power system and must itself suppress noise. Electronic products are subject to various industry standards and regulations regarding electromagnetic radiation and intersystem interference. As electronic data rates have increased into the gigahertz range, the increased signal transition time causes noise along a wide frequency range. Voltage signal noise suppression can be achieved through coupling of the voltage to a power source or ground. The proper design of printed circuit boards used in such products can make the difference between a product passing such signal integrity and electromagnetic compatibility (EMC) standards.

Proper decoupling capacitor design is a key element in a printed circuit board from signal integrity and EMC points of view. Power supply design is evolving and many theories have advanced to address problems. Although the primary focus of power source design is power handling capability, the design of suitable decoupling capacitors is often needed to reduce the radiation and noise emitted from the board. The traditional approach to this problem has been to provide a decoupling capacitance by the strong AC and/or DC coupling of that voltage to a power source or ground. This has been achieved by providing the printed circuit board with the addition of numerous discrete decoupling capacitors. However, analyzing suitable decoupling capacitors becomes difficult, particularly when printed circuit boards have multiple DC power supplies on the board and a large number of discrete capacitive components.

Conventional methods have relied on a trial-and-error physical testing of assembled boards to assess compliance with various regulations and standards. If the boards do not meet standards, various decoupling capacitor arrangements were modified and retested. This actual testing for compliance through trial and error design and testing has been both time-consuming and costly. It also requires test equipment to perform the testing. Often, this sophisticated testing in a controlled environment required sending of a designed printed circuit board (PCB) to a suitable test facility for testing. This is inconvenient and lengthens the design phase of a project waiting for compliance assurances.

SUMMARY

There is a need for an improved, cost-effective and time-saving process to design a power supply that achieves sufficient power supply noise suppression and signal integrity.

This disclosure provides a procedural and systematic way to theoretically analyze a PCB design using anti-resonant frequency to characterize the impedance of multiple DC power supplies on the PCB, taking decoupling capacitors and plane capacitance into account.

In accordance with one aspect of the disclosure, a formula is developed that combines plane capacitor and decoupling capacitor impedance.

In accordance with a further aspect of the disclosure, formulas are developed for defining the series and parallel resonance of decoupling capacitor branches.

In accordance with another aspect of the disclosure, a formula is developed for determining the anti-resonant frequencies of decoupling capacitors and plane capacitor.

In accordance with further aspects of the disclosure, the impedance of a decoupling capacitance is characterized taking series and parallel resonant frequencies of the decoupling capacitors into account.

In accordance with additional aspects, anti-resonant frequencies are analyzed to assess whether a current board design has sufficiently low impedance to meet required design criteria and/or regulations.

In accordance with an exemplary embodiment, the methodology is systematic and implemented in software or hardware to model impedance of a practical board with multiple DC power supplies based on plane capacitance and decoupling capacitors.

BRIEF DESCRIPTION OF THE DRAWINGS

The invention is described in detail with reference to the following figures, wherein like numerals reference like elements, and wherein:

FIG. 3 provides a chart showing a characterization of impedance levels at resonant frequencies for a first DC power supply and circuit on the PCB;

FIG. 4 provides a chart showing a characterization of impedance levels at resonant frequencies for a second DC power supply and circuit on the PCB;

FIG. 5 provides a chart showing a characterization of impedance levels at resonant frequencies for a third DC power supply and circuit on the PCB;

FIG. 6 provides a chart showing a total impedance at each resonant frequency for the PCB;

DETAILED DESCRIPTION OF EMBODIMENTS

Figure 1:
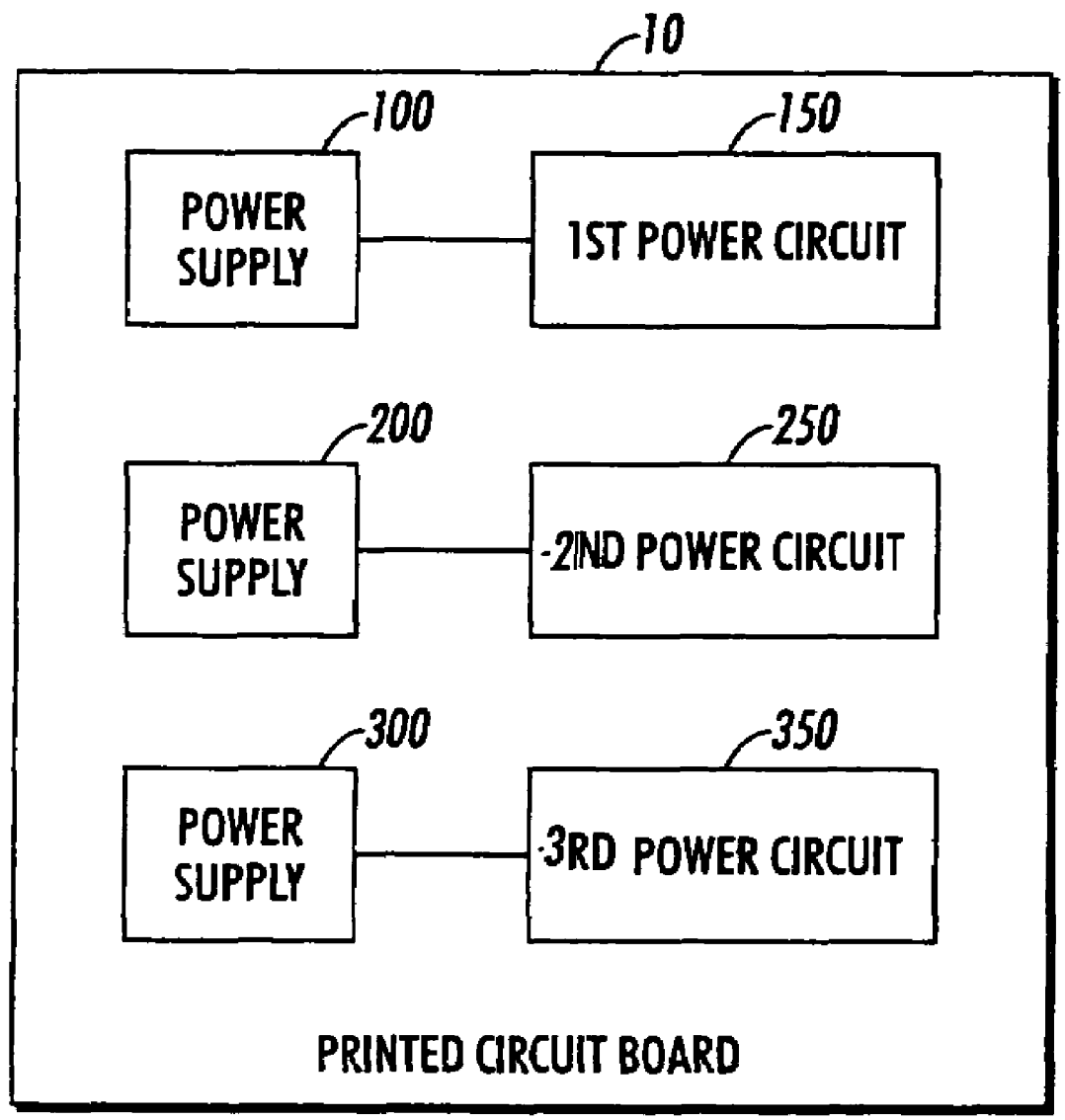
FIG. 1 shows an exemplary printed circuit board PCB with a plurality of DC power supplies, each powering one or more circuits.

FIG. 1 shows a representative printed circuit board (PCB) having a plurality of DC power supplies and circuits. In particular, FIG. 1 shows a printed circuit board (PCB) 10 having a first power supply 100 feeding power to a first power circuit 150, a second power supply 200 feeding power to a second power circuit 250, and third power supply 300 feeding power to a third power circuit 350. Each power supply 100, 200, 300 can operate at a different voltage and drive a load of different sizes. In an exemplary design, all three power supplies operate at 3.3V; however, each may operate at independent voltages.

Each power supply circuit also includes a different decoupling arrangement in both specific components and numbers of components. In this example, first circuit 150 includes 107 discrete non-ideal capacitor components, second circuit 250 includes 65 discrete non-ideal capacitor components and third circuit 350 includes 53 discrete non-ideal capacitor components. Each circuit and power supply is also affected by the capacitance of the board (board capacitance). These arrangements can be determined by any conventional or subsequently developed methodology. What is important is providing an initial decoupling design for compliance testing.

Because of the large number of components, it was previously thought to be extremely difficult to assess the noise suppression of the decoupling circuitry. Thus, the conventional approach followed physical trial-and-error testing of designed and constructed boards.

Aspects of the disclosure seek a characterization of noise suppression components by looking at the impedance of decoupling capacitors of multiple DC power supplies, such as 100, 200 and 300, of PCB 10 using anti-resonant frequencies. A desirable impedance of the decoupling capacitors should be low at least over the band of frequencies of interest. Because impedance will be high at anti-resonant frequencies due to the anti-resonant effect between decoupling capacitor branches, it is particularly critical in board design to assess the decoupling effect at such frequencies. Thus, it is not necessary to analyze all frequencies, but instead focus on the most problematic ones.

Aspects of this disclosure formulate the impedance for decoupling capacitors considering plane capacitance, series resonant frequencies, parallel resonant frequencies and impedance. The impedances are evaluated at anti-resonant frequencies, which have been found to be the problematic frequencies and potentials for high impedance. Once such impedances at selected frequencies have been determined, they can be compared to target values, set for example by various system integrity or EMI standards or design parameters, to assess whether a particular DC power supply system performs properly from signal integrity or electromagnetic radiation points of view. For example, a suitable target impedance may be less than 1 Ω. Then, only if the theoretical compliance has been established does a designed product have to be built and tested for actual, empirical compliance. This ability to readily assess a high probability of compliance prior to expensive board manufacture will reduce research and development time and budget, reducing possibly many iterations of board designs and trial and error physical testing.

Figure 2:
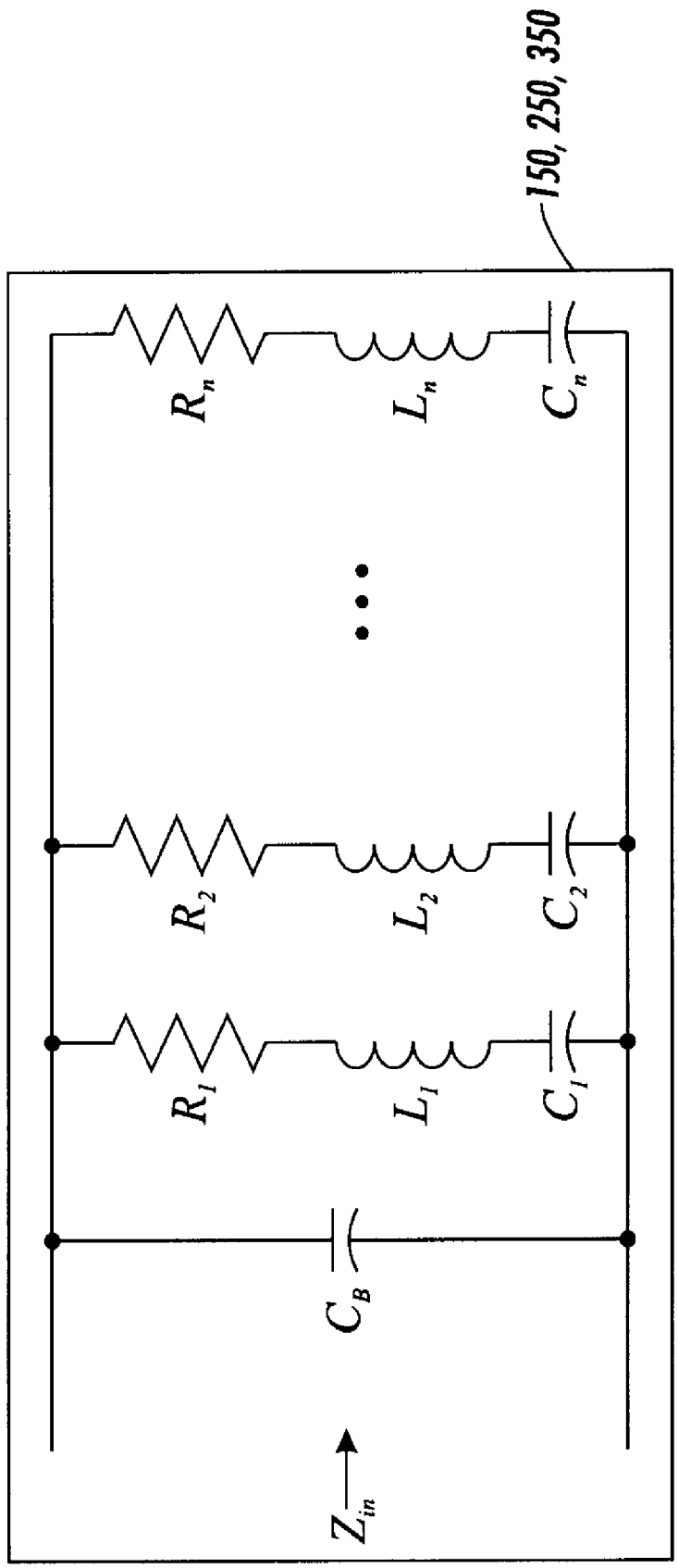
FIG. 2 shows an exemplary representation of each power supply and circuitry on the board.

It is important to have low impedance for plane and decoupling capacitor combinations in DC power supplies of PCB 10. A representation of plane capacitance and a decoupling capacitor combination equivalent circuit considering a practical range of frequency board size is shown in FIG. 2.

The net impedance of the power bus for each of circuits 150, 250 and 350 is:

$$Z_{in} = \frac{1}{j\omega C_B} \| \left( R_1 + j\omega L_1 + \frac{1}{j\omega C_1} \right) \| \left( R_2 + j\omega L_2 + \frac{1}{j\omega C_2} \right) \ldots \| \left( R_n + j\omega L_n + \frac{1}{j\omega C_n} \right) \quad (1)$$

If all of the decoupling capacitors are identical, that is, assuming $R_1 = R_2 = \ldots = R_n$, $C_1 = C_2 = \ldots = C_n$, $L_1 = L_2 = \ldots = L_n$, this expression can be simplified to:

$$Z_{in} = \frac{1}{\frac{1}{j\omega C_B} + \frac{n}{R_1 + j\omega L_1 + \frac{1}{j\omega C_1}}} = \quad (2)$$

$$\frac{1 + j\omega C_1 R_1 - \omega^2 L_1 C_1}{j\omega(C_B + nC_1) - \omega^2 C_B C_1 R_1 - j\omega^3 C_B L_1 C_1}$$

where j is $\sqrt{-1}$ and ω is the angular frequency in radians per second.

The effective series resonance for capacitors having a small $R_1$ (i.e. low ESR for capacitor, which is applicable) can be approximated to the following by neglecting the second terms in the numerator and denominator:

$$\omega_s = \frac{1}{\sqrt{L_1 C_1}} \text{ or } f_s = \frac{1}{2\pi \sqrt{L_1 C_1}} \quad (3)$$

The effective parallel resonance for capacitors having a small $R_1$ (i.e. low loss), can be approximated to the following:

$$\omega_p = \sqrt{\frac{C_B + nC_1}{C_B L_1 C_1}} = \omega_s \sqrt{1 + \frac{nC_1}{C_B}} \text{ or } f_p = f_s \sqrt{1 + \frac{nC_1}{C_B}} \quad (4)$$

Using Equations (2)–(4) for series resonant frequency, parallel resonant frequency and impedance for a board of 6"×9", the three power supplies 100, 200 and 300 and circuits 150, 250 and 350 are characterized and captured in FIGS. 3–5. The board capacitance, $C_B$, is the effective capacitance of the printed circuit board itself and can be determined knowing the effective area, depth and material. For an exemplary 6"×9" PCB, the plane or board capacitance $C_B$ is approximately 17.4 nF. The board capacitance is the capacitance between the power and ground planes in pF and equals:

$$C_{power\ plane} = \frac{0.22\varepsilon_r A}{d} \quad (5)$$

where $\varepsilon_r$=relative electric permeability of the insulator, A =area of shared power and ground planes (in.²), and d=separation between planes (inches).

For an exemplary board made by FR-4 epoxy, $\varepsilon_r$=4.5. Using Equation (5), with power and ground planes separated by 3 mils of FR-4, a power and ground plane capacitance is 333 pF/in². For a 6"×9" board of FR-4, the capacitance is approximately 17.4 nF.

The tables in FIGS. 3–5 are based on the power supply voltage level, value of decoupling capacitors, number of decoupling capacitors, identified anti-resonant frequencies, and real and imaginary parts of impedances. In this example, $R_1$ is 0.04Ω (the ESR of typical capacitors). 2nH is used for L1 (ESL) of the 0.1 uF decoupling capacitors and 1nH is used for L1 (ESL) of 0.01 uF decoupling capacitors and 0.001 uF decoupling capacitors. Column 1 identifies anti-resonant frequencies for each power supply expressed in Hertz. Column 2 identifies anti-resonant frequencies in radians. Columns 3–7 express partial components of equation (2) and columns 8–10 identify the denomination, real and imaginary components of impedance Y.

FIG. 6 shows a total of the real part and imaginary part of impedances for the exemplary three power supply circuits in PCB 10. Columns 1–2 express the anti-resonant frequencies in Hertz and radians as in the other Figs. Columns 3–10 express the various admittances Y. Columns 11–12 show the resultant combined approximation of total impedances from the three circuits at the three anti-resonant frequencies. These computed values theoretically describe anticipated performance of the decoupling circuits on the board.

The total computed impedances Z in FIG. 6 can then be compared with appropriate standards or design criteria for compliance. For example, a target impedance of <1 Ω is acceptable for many applications from signal integrity and EMI points of view. Thus, this particular decoupling design on the exemplary board can be readily confirmed as compliant by assessment of columns 11–12 of FIG. 6 with the target. Once verified, the design can be finalized and fabricated for actual physical testing.

Figure 7:
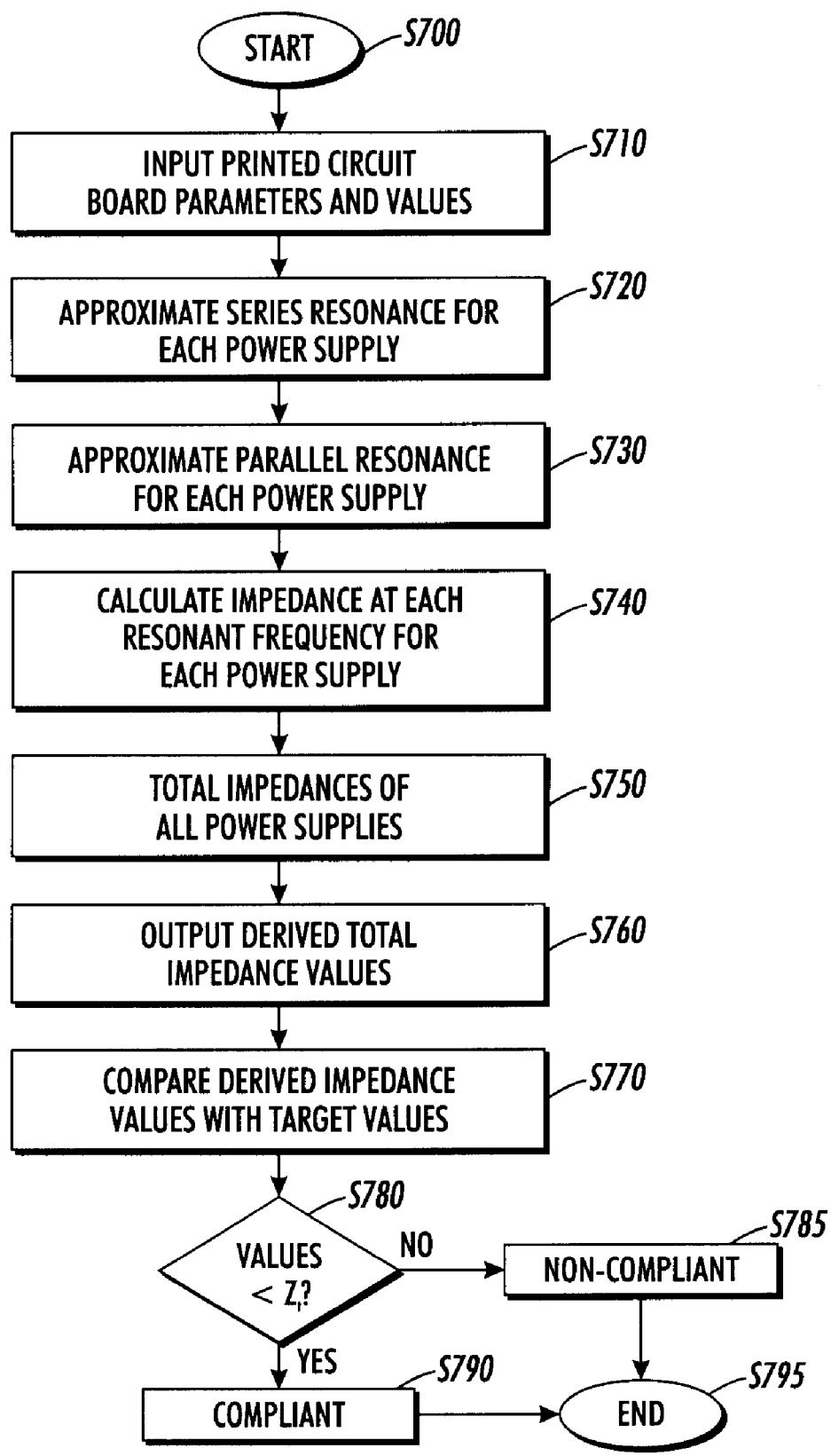
FIG. 7 shows a flowchart of a process for theoretically characterizing multiple DC supply decoupling capacitors in a printed circuit board using analysis of anti-resonant frequencies.

FIG. 7 describes a flowchart of an exemplary process for systematically assessing the effectiveness of decoupling capacitance in a printed circuit board having at least one power supply by analysis of anti-resonant frequencies and board capacitance. The process starts at step S700 and advances to step S710 where printed circuit board parameters are input, along with values for non-ideal discrete capacitors provided in the board design for each power supply in the board, including capacitor capacitance, resistance and inductance values. From step S710, flow advances to step S720 where the series resonance is approximated for each DC power supply circuit on the board. This can be achieved using equation (3). From step S720, flow advances to step S730 where the parallel resonance is approximated for each DC power supply circuit on the board. This can be achieved using equation (4).

From step S730, flow advances to step S740 where impedance is determined for each power supply circuit on the board at each resonant frequency. This can be achieved using equation (2). From step S740, flow advances to step S750 where the separate impedances from the one or more DC power supply circuits are totaled to derive total impedance values for the board that have been characterized at relevant anti-resonant frequencies. Prior to totaling, the various admittances are added since they are in parallel and then inversed to obtain total impedance.

From step S750, flow advances to step S760, where the derived total impedance values are output in a displayable or printable form. From step S760, flow advances to step S770 where the derived theoretical board impedance values for relevant anti-resonant frequencies are compared with a target impedance, such as that dictated by various regulations or design criteria, such as from signal integrity or EMI radiation view points. From step S770, flow advances to step S780 where a determination of compliance or non-compliance is made. If the impedance values are above the target impedance, flow advances to step S785 where it is determined that the impedance is non-compliant. If the impedance values are at or below the target impedance, flow advances to step S790 where it is determined that the impedance is compliant. The process ends at step S795.

The above procedure provides an improved method for design and testing of a power supply system to meet system integrity and electromagnetic interference regulations and standards. The method focuses on determining a target impedance, and calculating theoretical decoupling impedance at anti-resonant frequencies considering decoupling capacitance, board capacitance, and series and parallel resonance.

This procedure contains both calculations and decision making processes. The calculations and processes outlined may be implemented manually or may be partially or fully automated by entering various calculations and specification data for variables using conventional input devices, such as a keypad, keyboard, mouse, pointer, upload of saved files, etc. into a spreadsheet program such as Microsoft Excel. However, the method may be implemented on a programmed general purpose computer. It may also be implemented on a special purpose computer, such as a graphing calculator, a programmed microprocessor or microcontroller and peripheral integrated circuit element, an ASIC, or other integrated circuit, a digital signal processor, a hard-wired electronic or logic circuit such as a discrete element circuit, a programmable logic device such as a PLD, PLA, FPGA, PAL, or the like. In general, any device capable of implementing a finite state machine that is in turn capable of implementing the flowcharts shown in FIG. 7 can be used to implement the process.

However, the disclosed process may also be readily implemented in software using object or object-oriented software development environments that provide portable source code that can be used on a variety of computer, workstation and/or personal digital assistant hardware platforms. For example, the entire procedure could be implemented in a programming language, such as Visual C++. Various input data to the program could be either entered manually or downloaded into a database or lookup table based on manufacture specifications as explained in the above procedure. Decision loops yields a program that performs the process steps and calculations in FIG. 7 to test the impedance of a noise suppression decoupling capacitive structure on a multiple DC power supplied PCB.

Figure 8:
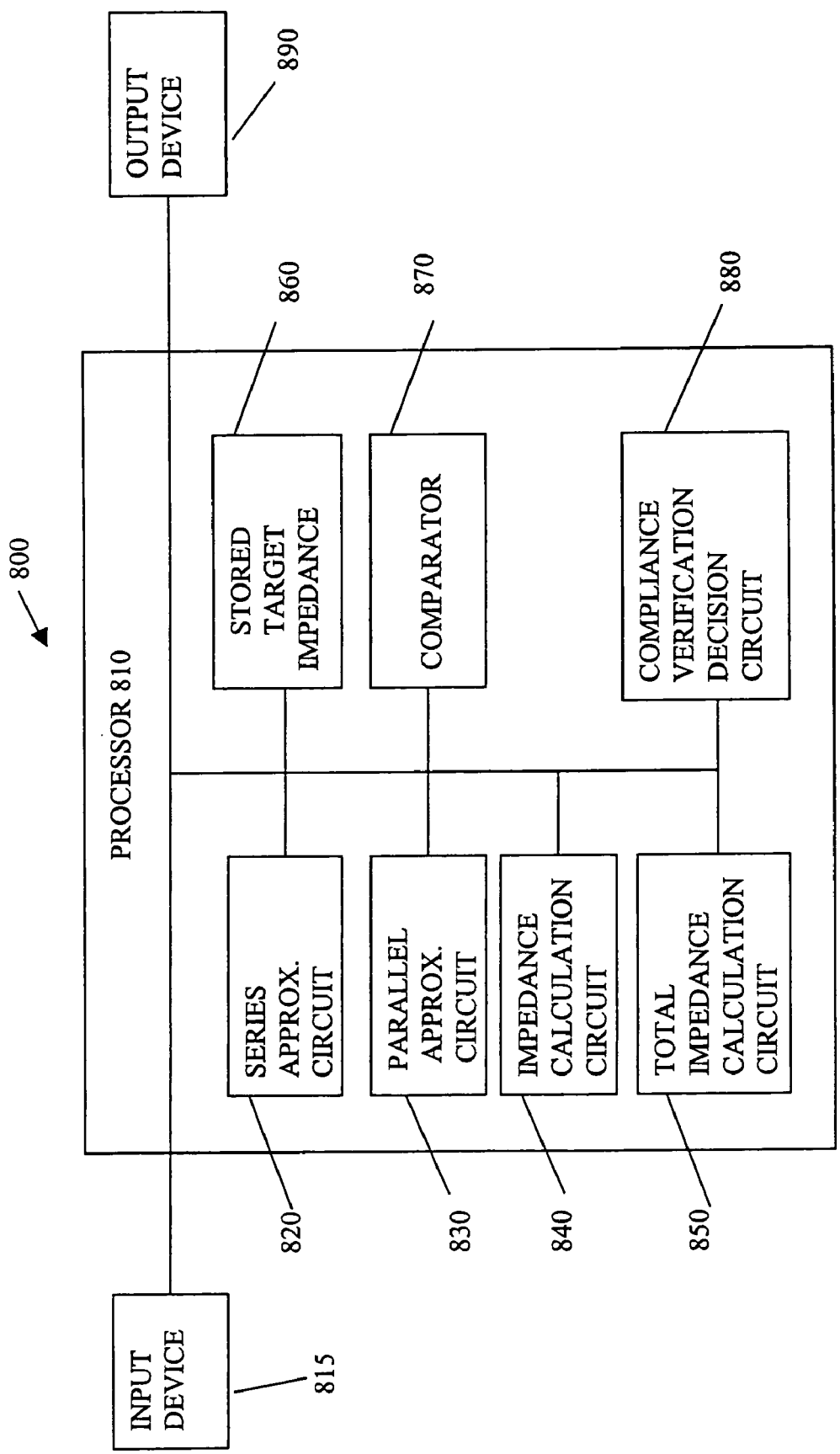
FIG. 8 shows a representative schematic of a computer system for performing the steps of FIG. 7.

FIG. 8 shows a representative schematic of a computer system for performing the steps of FIG. 7. System 800 includes processor 810, series approximation circuit 820, parallel approximation circuit 830, impedance calculation circuit 840, total impedance calculation circuit 850, stored target impedance 860, comparator 870, and compliance verification decision circuit 880. Processor 810 receives input from input device 815 and outputs to output device 890.

It will be appreciated that various of the above-disclosed and other features and functions, or alternatives thereof, may be desirably combined into many other different systems or applications. Also, various presently unforeseen or unanticipated alternatives, modifications, variations or improvements therein may be subsequently made by those skilled in the art, and are also intended to be encompassed by the following claims.

What is claimed is:

1. A systematic method for theoretically assessing the effectiveness of decoupling capacitance in noise suppression in a printed circuit board having at least one DC power supply by analysis of anti-resonant frequencies and discrete capacitor component values, comprising:

inputting circuit board parameters along with values for non-ideal discrete capacitors provided in the board design for each power supply in the board, including capacitor capacitance, resistance and inductance values;

approximating the series resonance for each DC power supply circuit on the board;

approximating the parallel resonance for each DC power supply circuit on the board;

approximating impedance for each power supply circuit on the board at each anti-resonant frequency;

totaling the impedance from each power supply circuit on the board to derive total impedance values for the board that have been characterized at the relevant anti-resonant frequencies;

outputting the derived total approximated impedance values at the anti-resonant frequencies;

comparing the derived theoretical board impedance values at the relevant anti-resonant frequencies with a target impedance representing a desired design criteria for the printed circuit board; and making a determination of compliance or non-compliance based on the comparison with the target impedance; and outputting an indication of compliance or non compliance through an output device.

2. The method according to claim 1, wherein multiple power supplies are provided on the board.

3. The method according to claim 2, wherein parallel resonance is determined by any of the equations:

$$\omega_p = \sqrt{\frac{C_B + nC_1}{C_B L_1 C_1}} = \omega_s \sqrt{1 + \frac{nC_1}{C_B}} \text{ or } f_p = f_s \sqrt{1 + \frac{nC_1}{C_B}},$$

where $C_B$ is the board capacitance, $L_1$ is the inductance of the non-ideal capacitors and $C_1$ is the capacitance of the non-ideal capacitors.

4. The method according to claim 2, wherein individual impedance of each power supply circuit is determined by the equation:

$$Z_{in} = \cfrac{1}{\cfrac{1}{\cfrac{1}{j\omega C_B}} + \cfrac{n}{R_1 + j\omega L_1 + \cfrac{1}{j\omega C_1}}} = \frac{1 + j\omega C_1 R_1 - \omega^2 L_1 C_1}{j\omega(C_B + nC_1) - \omega^2 C_B C_1 R_1 - j\omega^3 C_B L_1 C_1},$$

where $C_B$ is the board capacitance, $L_1$ is the inductance of the non-ideal capacitors, $C_1$ is the capacitance of the non-ideal capacitors, $R_1$ is the resistance of the non-ideal capacitors, $j=\sqrt{-1}$ and $\omega$ is angular frequency in radians per second.

5. The method according to claim 1, wherein the input parameters include information to derive the board capacitance $C_B$ and the impedance is derived from the board capacitance.

6. The method according to claim 1, wherein series resonance is determined by either of the equations:

$$\omega_s = \frac{1}{\sqrt{L_1 C_1}} \text{ or } f_s = \frac{1}{2\pi\sqrt{L_1 C_1}},$$

where $L_1$ is the inductance of the non-ideal capacitors and $C_1$ is the capacitance of the non-ideal capacitors.

7. A system for theoretically assessing the effectiveness of decoupling capacitance in noise suppression in a printed circuit board having at least one DC power supply by analysis of anti-resonant frequencies and discrete capacitor component values, comprising:

an input device that inputs circuit board parameters along with values for non-ideal discrete capacitors provided in the board design for each power supply in the board, including capacitor capacitance, resistance and inductance values;

a processor including a series approximation circuit that approximates the series resonance for each DC power supply circuit on the board;

a parallel approximation circuit that approximates the parallel resonance for each DC power supply circuit on the board;

a power supply impedance calculation circuit that approximates impedance for each power supply circuit on the board at each anti-resonant frequency;

a total impedance calculation circuit that totals the impedance from each power supply circuit on the board to derive total impedance values for the board that have been characterized at the relevant anti-resonant frequencies;

a comparator that compares the derived theoretical board impedance values at the relevant anti-resonant frequencies with a target impedance representing a design criteria;

a compliance verification circuit that indicates compliance or non-compliance of the printed circuit board based on the comparison with the target impedance; and an output device that indicates compliance or non-compliance.

8. The system according to claim 7, wherein multiple power supplies are provided on the board.

9. The system according to claim 7, wherein the input parameters include information to derive the board capacitance $C_B$ and the impedance is derived from the board capacitance.

10. The system according to claim 7, wherein series resonance is determined by either of the equations:

$$\omega_s = \frac{1}{\sqrt{L_1 C_1}} \text{ or } f_s = \frac{1}{2\pi\sqrt{L_1 C_1}},$$

where $L_1$ is the inductance of the non-ideal capacitors and $C_1$ is the capacitance of the non-ideal capacitors.

11. The system according to claim 7, wherein parallel resonance is determined by any of the equations:

$$\omega_p = \sqrt{\frac{C_B + nC_1}{C_B L_1 C_1}} = \omega_s \sqrt{1 + \frac{nC_1}{C_B}} \text{ or } f_p = f_s \sqrt{1 + \frac{nC_1}{C_B}},$$

where $C_B$ is the board capacitance, $L_1$ is the inductance of the non-ideal capacitors and $C_1$ is the capacitance of the non-ideal capacitors.

12. The system according to claim 7, wherein individual impedance of each power supply circuit is determined by the equation:

$$Z_{in} = \cfrac{1}{\cfrac{1}{\cfrac{1}{j\omega C_B}} + \cfrac{n}{R_1 + j\omega L_1 + \cfrac{1}{j\omega C_1}}} = \frac{1 + j\omega C_1 R_1 - \omega^2 L_1 C_1}{j\omega(C_B + nC_1) - \omega^2 C_B C_1 R_1 - j\omega^3 C_B L_1 C_1},$$

where $C_B$ is the board capacitance, $L_1$ is the inductance of the non-ideal capacitors, $C_1$ is the capacitance of the non-ideal capacitors, and $R_1$ is the resistance of the non-ideal capacitors $j=\sqrt{-1}$ and $\omega$ is angular frequency in radians per second.

* * * * *